US006643222B2

(12) United States Patent
Osborn et al.

(10) Patent No.: US 6,643,222 B2
(45) Date of Patent: Nov. 4, 2003

(54) WAVE FLEXTENSIONAL SHELL CONFIGURATION

(75) Inventors: Jason W. Osborn, Amherst, NH (US); Matthew M. DeAngelis, Bedford, NH (US); Jeffrey J. Enos, Bedford, NH (US)

(73) Assignee: BAE Systems Information and Electronic Systems Integration INC, Nashua, NH (US)

( * ) Notice: Subject to any disclaimer, the term of this patent is extended or adjusted under 35 U.S.C. 154(b) by 0 days.

(21) Appl. No.: 10/310,609

(22) Filed: Dec. 5, 2002

(65) Prior Publication Data

US 2003/0128628 A1 Jul. 10, 2003

Related U.S. Application Data

(60) Provisional application No. 60/347,404, filed on Jan. 10, 2002.

(51) Int. Cl.[7] .......................... H04R 17/00; H04R 1/44; H01L 41/02

(52) U.S. Cl. ....................... 367/174; 367/141; 367/163; 310/337

(58) Field of Search ................................ 367/141, 163, 367/165, 174; 310/328, 337

(56) References Cited

U.S. PATENT DOCUMENTS

| | | | | | |
|---|---|---|---|---|---|
| 4,651,044 | A | | 3/1987 | Kompanek | |
| 4,864,548 | A | * | 9/1989 | Butler | 310/337 |
| 4,964,106 | A | * | 10/1990 | Bromfield | 367/165 |
| 5,122,992 | A | | 6/1992 | Kompanek | |
| 5,267,223 | A | | 11/1993 | Flanagan et al. | |
| 5,291,461 | A | * | 3/1994 | Boeglin et al. | 367/174 |
| 5,345,428 | A | * | 9/1994 | Arnold et al. | 367/165 |
| 5,592,359 | A | | 1/1997 | Kompanek | |
| 5,805,529 | A | * | 9/1998 | Purcell | 367/174 |
| 6,278,658 | B1 | | 8/2001 | Skinner et al. | |
| 6,298,012 | B1 | * | 10/2001 | Benjamin | 367/174 |
| 6,465,936 | B1 | * | 10/2002 | Knowles et al. | 310/328 |

FOREIGN PATENT DOCUMENTS

WO WO87/05773 * 9/1987

* cited by examiner

*Primary Examiner*—Ian J. Lobo
(74) *Attorney, Agent, or Firm*—Maine & Asmus

(57) ABSTRACT

A flextensional transducer projector shell design is disclosed. The shell design has a shape formed so as to reduce the stress placed on the transduction driver as compared to other shell designs. The shell design includes first and second bulbous end portions, which can each be adapted to receive a respective end of a transduction driver. A middle portion of the shell design has both concave sections and convex sections, thereby defining a wave profile.

23 Claims, 7 Drawing Sheets

WAVE FLEXTENSIONAL SHELL CONFIGURATION

RELATED APPLICATIONS

This application claims the benefit of U.S. Provisional Application No. 60/347,404, filed Jan. 10, 2002, which is herein incorporated in its entirety by reference.

FIELD OF THE INVENTION

The invention relates to acoustic transducers, and more particularly, to flextensional projectors having shell geometry allowing a substantially constant driver stress over a broad range of depths.

BACKGROUND OF THE INVENTION

Acoustical transducers convert electrical energy to acoustical energy, and vice-versa, and can be employed in a number of applications. For example, transducers are a primary component used in sonar applications such as underwater seismic prospecting and detection of mobile vessels. In such applications, acoustic transducers are generally referred to as projectors and receivers. Projectors convert electrical energy into mechanical vibrations that imparts sonic energy into the water. Receivers are used to intercept reflected sonic energy and convert the associated mechanical vibrations into electrical signals. Multiple projectors and receivers can be employed to form arrays for detecting underwater objects.

In a typical underwater application, marine vessels tow acoustic projectors that generate acoustical energy in the surrounding area to conduct geophysical testing. The acoustical energy travels through the water and underlying subsurface geologic structures. Some of the acoustical energy is reflected back from the geologic structures and is detected with geophone or hydrophone sensors.

A projector typically includes an electromechanical stack of ceramic or rare earth elements having a particular crystalline structure. Depending on its crystal structure and material, a projector may be, for example, piezoelectric, electrostrictive, or magnetostrictive. For instance, if a ceramic crystal is subjected to a high direct current voltage during the manufacturing process, the ceramic crystal becomes permanently polarized and operates as a piezoelectric. An electrical signal applied to the ceramic crystal generates mechanical vibrations. A plurality of such crystals can be configured in a stack to provide greater vibrations, and is commonly referred to as a "driver" or "transduction driver."

In another instance, direct current voltage can be temporarily applied to a ceramic stack during operation to provide polarization of the crystals. Under such conditions, the operation of the projector is electrostrictive. After the application of direct current voltage is discontinued. the electrostrictive ceramic stack is no longer polarized, and vibrations stop. In a third instance, a magnetostrictive stack is exposed to a direct current magnetic field via a coil and the stack material magnetic domains are aligned. An electrical signal applied to the coil causes the stack to generate vibrations.

One type of projector is a flextensional sonar projector, which is typically a low frequency transducer. Low frequency acoustic signals are desirable because they are less attenuated by the water through which they travel, which allows the signals to travel great distances. A flextensional transducer includes a transduction driver housed in a mechanical shell. The transduction driver is actuated by application of an electrical signal, which produces magnified vibrations in the shell thereby generating acoustic waves in the water. The shell vibrations are dependent upon the properties of the stack material included in the driver.

Flextensional acoustical projectors are used in active sonar applications, underwater seismic surveying, and other similar applications. Class VII and class IV flextensional projectors employ configurations which impart a substantial amount of stress on the transduction driver as the operating depth changes. For example, driver stress decreases with greater operating depth for class IV transducers. To provide sufficient stress at maximum depth, the driver must have a high initial stress. More specifically, the shell is used to pre-stress the driver by inserting the driver while the shell is under outward radial expansion. Relaxation of the shell places the driver in a compressed state. Structural limits associated with the high initial stress effectively limit the operating depth of the transducer.

Class VII transducers, on the other hand, have an opposite constraint, where operating stress increases with greater operating depth. This increase in stress reduces driver capabilities and performance with increased depth. In addition, conventional stress reduction techniques, such as delaying the application of stress to the driver, limit the shallow depth at which the transducer can operate.

What is needed, therefore, is a flextensional projector shell configuration having a stress profile that is substantially independent from depth of operation.

BRIEF SUMMARY OF THE INVENTION

One embodiment of the present invention provides a flextensional transducer. The transducer includes a projector shell that is disposed about a transduction driver. The transduction driver has a first and a second end, and is adapted for receiving power from an alternating supply. The shell includes first and second bulbous end portions, each adapted to receive a respective end of the transduction driver. The shell further includes a middle portion that has both concave sections and convex sections, thereby defining a wave profile. In one particular embodiment, stress on the driver is substantially independent of operating depth. The flextensional transducer may further include a flexible water-proof material or boot covering the projector shell that is adapted to keep internal componentry (e.g., the transduction driver) dry.

Another embodiment of the present invention provides a flextensional transducer projector shell. The shell includes first and second bulbous end portions, and a middle portion having both concave sections and convex sections, thereby defining a wave profile. A recess may be defined in each respective bulbous end portion for retaining each end of a transduction driver. In one particular embodiment, the shell has a midpoint, and there are two opposing convex sections, each having a peak that is substantially aligned with the midpoint. In addition, there is a pair of opposing concave sections between each bulbous end portion and the opposing convex sections.

Another embodiment of the present invention provides a method of manufacturing a flextensional transducer projector shell. The method includes forming first and second bulbous end portions, and forming a middle portion having both concave sections and convex sections, thereby defining a wave profile. In one such embodiment, forming the first and second bulbous end portions includes forming a recess in each respective bulbous end portion for retaining each end of a transduction driver. The method may further include disposing the shell about a transduction driver with the driver's ends each retained by a respective bulbous end portion. The driver can be adapted for receiving power from an alternating supply.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1A:
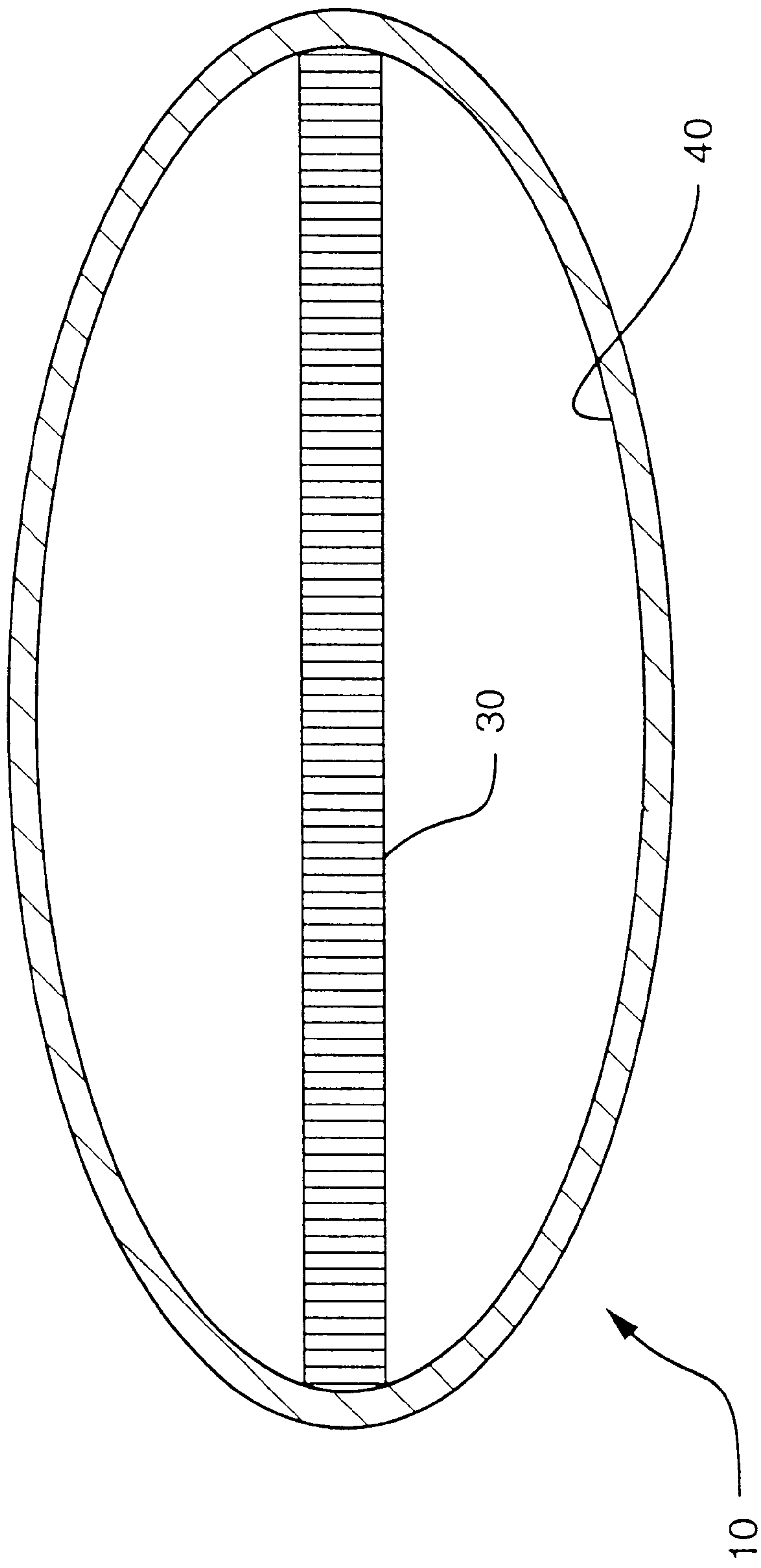
FIG. 1A (PRIOR ART)
FIG. 1*a* is a side view of a conventional class IV flextensional transducer showing the piezoelectric element retained at the midsection of the oval shaped shell.

A conventional class IV flextensional transducer 10 is shown in FIG. 1*a* to illustrate general characteristics and operating principles. As can be seen, a driver 30, typically a stack of piezoelectric ceramic elements, is retained within an oval shaped shell 40. The actuation of the driver 30 causes the shell 40 to generate the acoustic vibrations, which are imparted into the surrounding water.

Figure 1B:
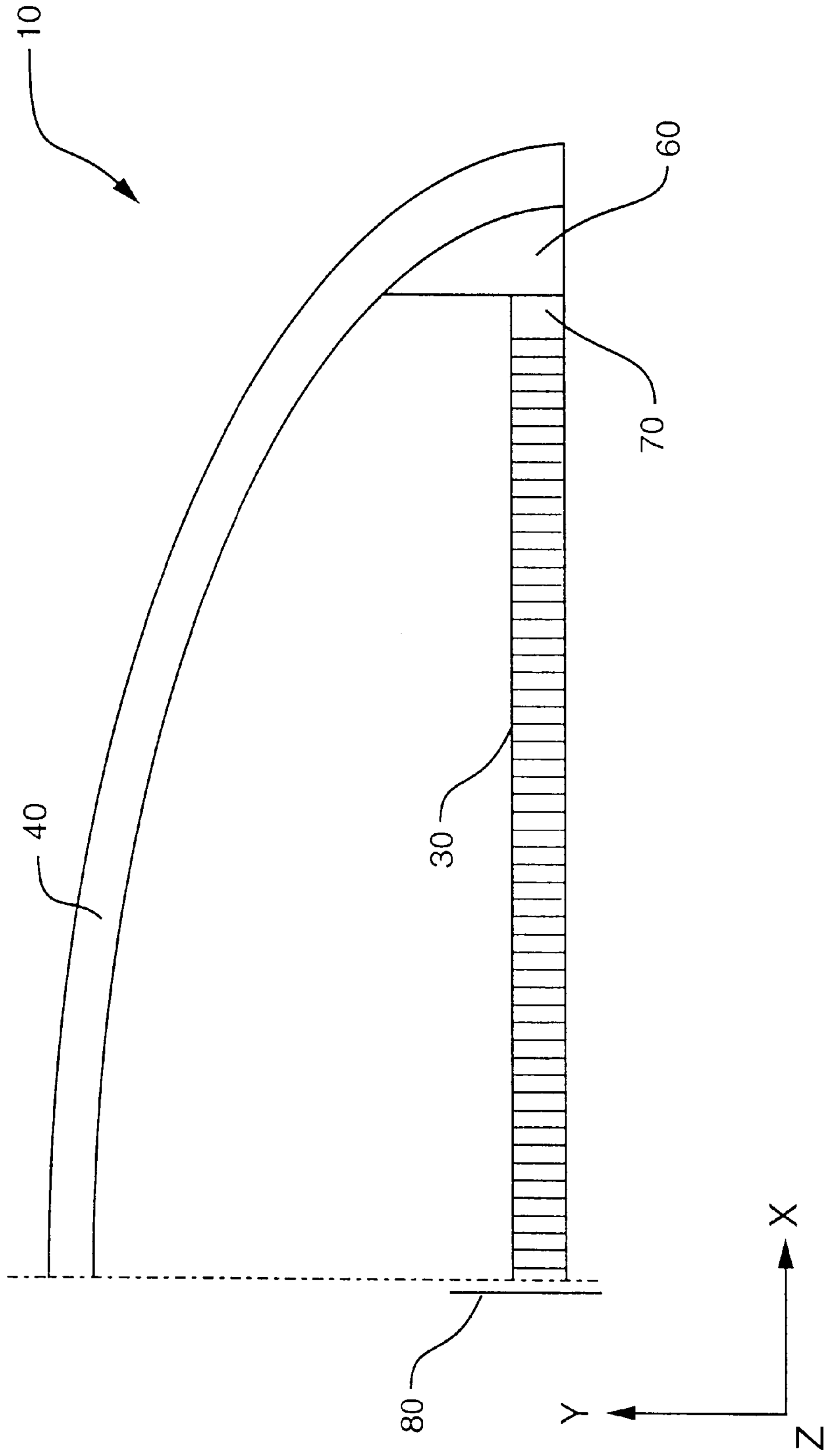
FIG. 1B (PRIOR ART)
FIG. 1*b* is a quarter sectional view of the class IV flextensional shell geometry of FIG. 1*a*.

FIG. 1*b* is a quarter sectional view of the flextensional shell 10 geometry of FIG. 1*a*. The oval class IV shell 40 is shown (one-quarter view) with the driver 30 connecting to an aluminum end plate 70 that further connects to a D-insert end element 60. The D-insert end element 60 allows the driver 30 to fit properly, and is shaped to provide a proper abutment for the driver 30. An aluminum center plate 80 provides additional support to the driver 30. In a full view, the shell 40 is convex. The inside of the shell 40 is filled with air, which provides an impedance difference between the internal area of the shell 40 and the external fluid (e.g., sea water). This allows for robust acoustic transmission.

Figure 2:
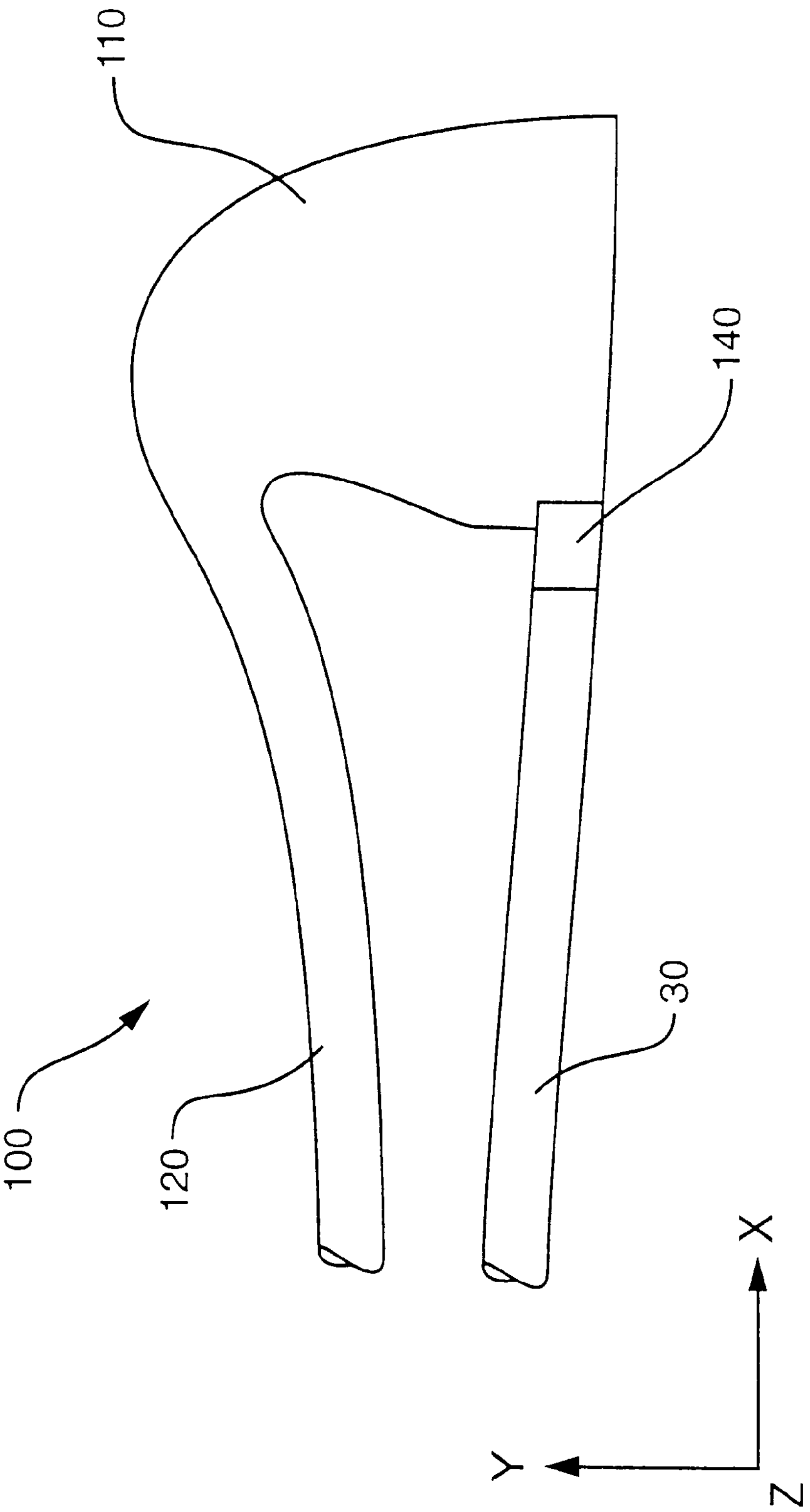
FIG. 2 (PRIOR ART)
FIG. 2 is a quarter sectional view of a conventional class VII flextensional shell geometry.

FIG. 2 shows the geometry of a class VII shell 100 in a one-quarter view. The shell design includes two bulbous end portions 110 and a concave middle portion 120 about a stack. 30. A pole piece 140 is located as indicated. In a full view, the shell 100 is dogbone shaped. In both the conventional class IV and VII shell designs, considerable stress is exerted on the stack material of the driver 30 as the operating depth changes, which can damage the driver.

Figure 3A:
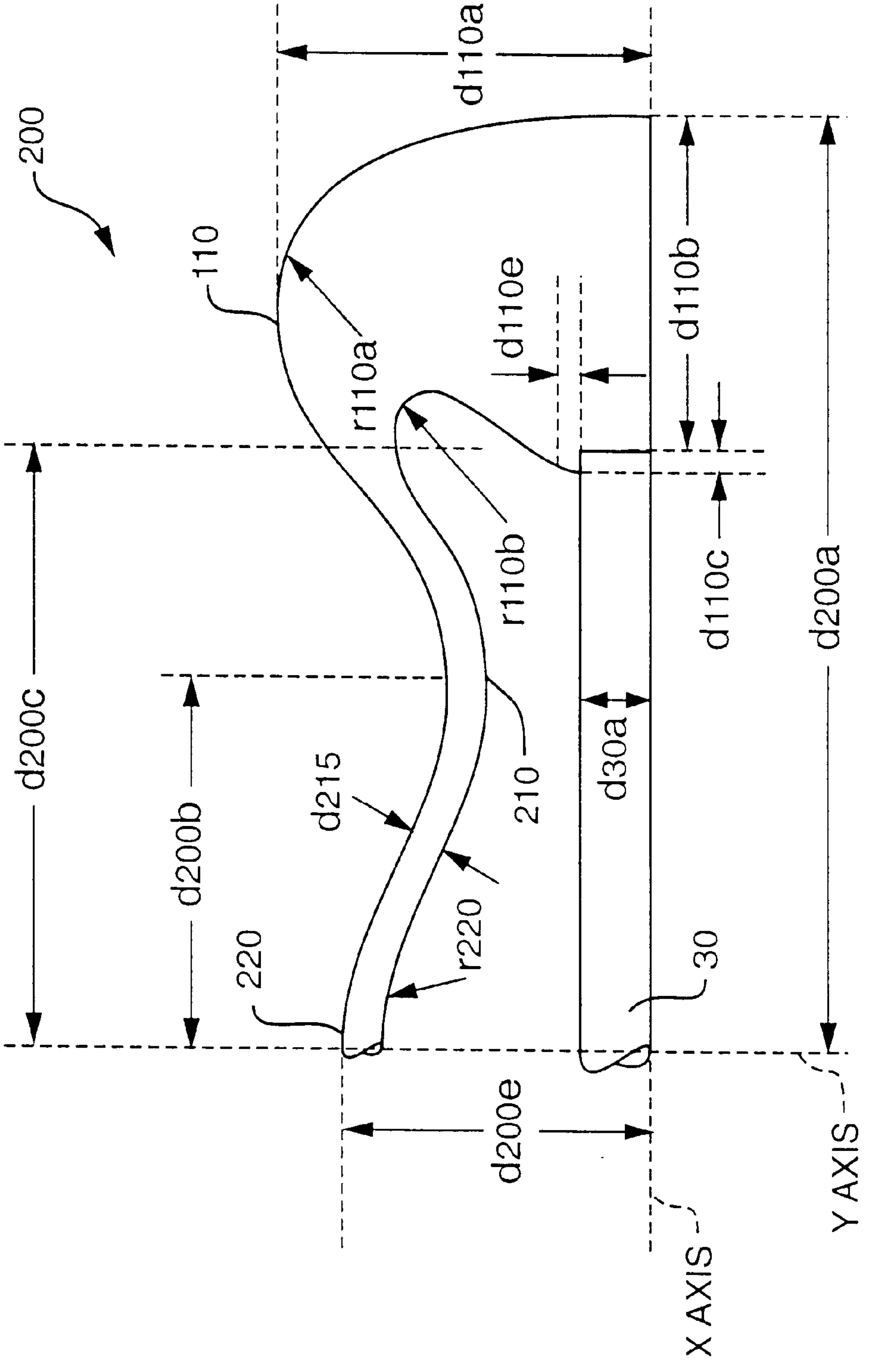
FIG. 3*a* is a quarter sectional view of a flextensional transducer projector shell geometry configured in accordance with one embodiment of the present invention.

FIG. 3*a* is a quarter sectional view of a flextensional transducer projector shell geometry configured in accordance with one embodiment of the present invention. The flextensional transducer projector shell 200 is disposed about a transduction driver 30, and includes a bulbous end portion 110 at each end of driver 30, and a middle portion. The bulbous end portions 110 are each adapted to receive a respective end of the driver 30. The middle portion includes concave sections 210 and convex sections 220 about the driver 30, thereby defining a "wave" profile.

As can be seen, the wave profile includes a number of minimum points corresponding to the troughs of the concave sections 210, and a number of maximum points corresponding to the peaks of the convex sections 220. In this embodiment, each end of the transduction driver 30 is retained in recesses formed in the respective bulbous end portions 110. Note that the driver 30 can further be adapted for receiving power from an alternating supply as is conventionally done.

The wave geometry of shell 200 imparts little or no undesired stress on the stack material of driver 30 or the wave form along the major shell 200 axis. The shell 200 design is limited only by the yield strength of the shell material used. As newer composites are developed and become available, they may be used in conjunction with the principles disclosed herein.

The flextensional transducer projector shell 200 material can be, for example, aluminum, steel, titanium, graphite fiber/epoxy composite, glass fiber/epoxy composite, or other suitable projector shell materials. In addition, note that the shell 200 can be a solid metal, solid composite, honey comb metallic, honey comb composite, or a combination thereof.

The material of transduction driver 30 can be, for example, piezoelectric, ferroelectric, or rare earth elements. The driver 30 can have a number of shapes, such as rectangular, square, circular, or some irregular shape depending on the shape of the individual elements making up the stack.

Note that the geometry is symmetrical about the x and y axis. The dimensions demonstrated for this one quarter view can therefore be used to specify a full shell design. In one specific embodiment of the present invention, the flextensional transducer includes an aluminum shell, and employs ceramic piezoelectric transducer elements in the driver, and has the following dimensions:

Distance d110*a*=8 inches;
Distance d110*b*=6.5 inches;
Distance d110*c*=0.5 inches;
Distance d110*e*=0.5 inches;
Radius r110*a*=3.75 inches;
Radius r110*b*=1.0 inches;
Distance d215=0.8 inches;
Radius r210=6.0 inches;
Radius r220=6.0 inches;
Distance d30*a*=1.55 inches;
Distance d30*b*=1.1 inches (FIG. 3*c*);
Distance d217=1.5 inches (FIG. 3*c*);
Distance d219=0.2 inches (FIG. 3*c*);
Distance d200*a*=18.75 inches;
Distance d200*b*=7.0 inches;
Distance d200*a*=12.25 inches; and
Distance d200*e*=6.5 inches.

This particular embodiment provides a mechanical quality factor $Q_m$ of 2 to 3, an acoustic output power greater than 210 dB re $\mu$Pa at 1 mW, and an in water resonant frequency of less than 300 Hz. As the stress in the shell 200 increases with depth, the stress on the driver 30 only increases at about 1% of that increased shell stress. Thus, the driver stress can be optimally set (e.g., during assembly of the transducer), and will remain substantially constant as depth of operation changes.

Note that this specific embodiment is not intended to limit the present invention. Rather, the example dimensions merely illustrate one embodiment. Numerous dimensions, material types, and shell geometries can be implemented in accordance with the principles of the present invention.

Known manufacturing techniques can be employed to fabricate a flextensional transducer projector shell in accordance with the principles of the present invention. Conventional milling and molding methods, for example, can be used to form the shell 200 from metallic or composite materials. Once the shell is formed, it can be flexed so as to allow insertion of the transduction driver into the proper location within the shell. Alternatively, the shell can be formed around the driver, assuming the final assembly will properly retain the driver. Shell sides can be installed after the bulbous end portions and middle wave portion are disposed about the driver. In any case, a flextensional transducer projector shell is disposed about a driver to provide a functional transducer.

Other materials such as dielectric coatings and rubber boots, may be employed to protect the transducer componentry. For example, a water-proof rubber "boot" can be employed to cover the entire radial surface that is adapted to keep the projector shell dry. For instance, a thickness of about ⅛ to ¾ inches of fiber reinforced rubber (e.g., Nylon fiber reinforced neoprene) can be used as the boot. Other flexible water proofing material can be used here as well. Also, control electronics for receiving and processing power sequences that are applied to the transducer elements of driver 30 may be included inside the hollow of the shell. Likewise, a processor (e.g., microcontroller unit) or other smart circuitry may also be included that is programmed to carry out a specific function, such as a specific output vibration sequence (e.g., 120 Hz on for 5 seconds, off for 10 seconds, repeat). Numerous process algorithms are possible.

Figure 3B:
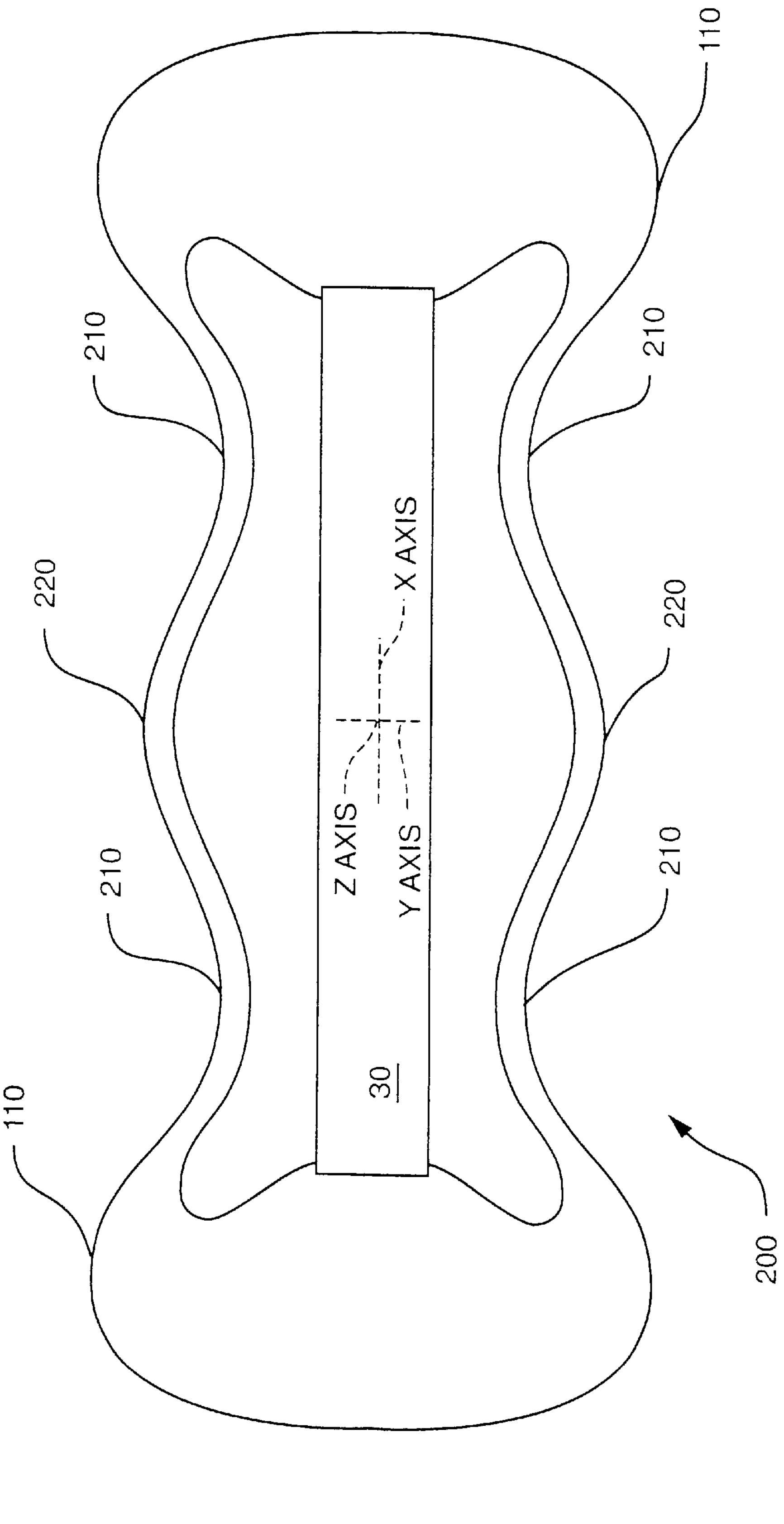
FIG. 3*b* is a full sectional side view of the flextensional transducer projector shell illustrated in FIG. 3*a*.
Figure 3C:
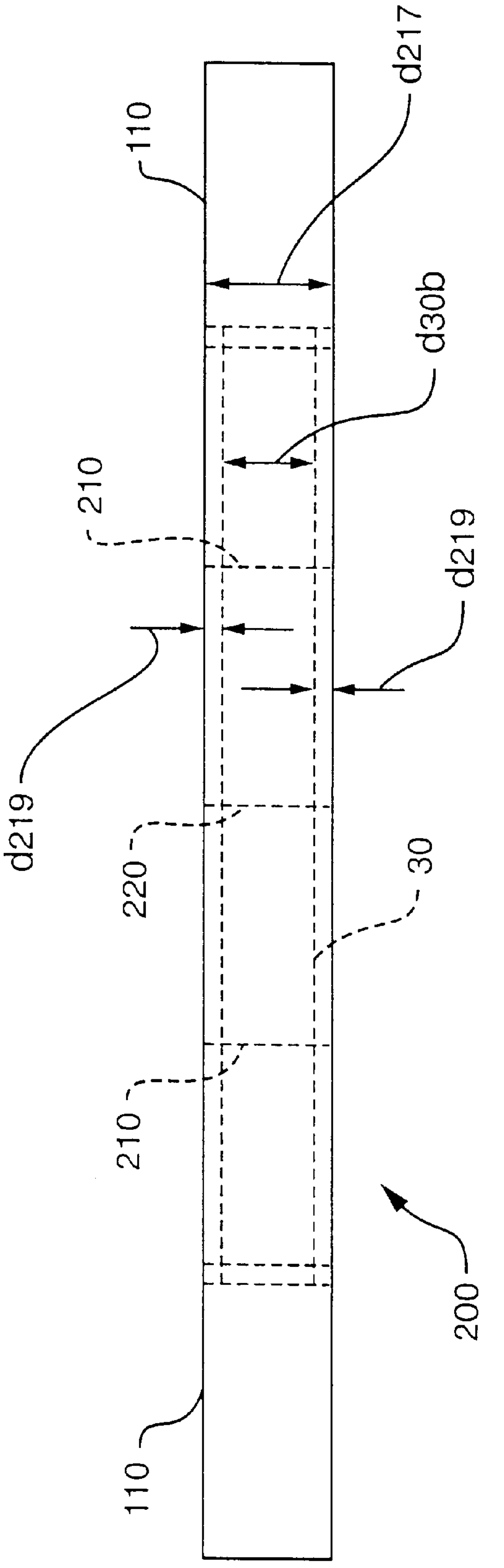
FIG. 3*c* is a full top view of the flextensional transducer projector shell illustrated in FIGS. 3*a* and 3*b*.
Figure 4A:
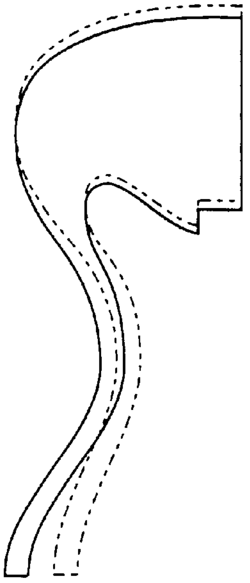
FIGS. 4*a* through 4*d* each illustrate quarter sectional views of dynamic modes of a flextensional transducer projector shell geometry configured in accordance with one embodiment of the present invention.
Figure 4B:
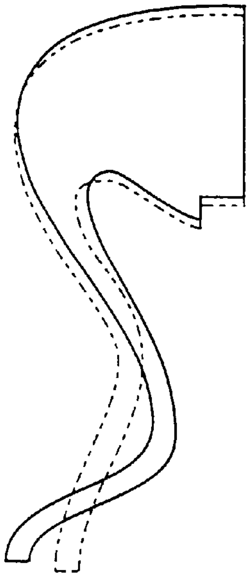
Figure 4C:
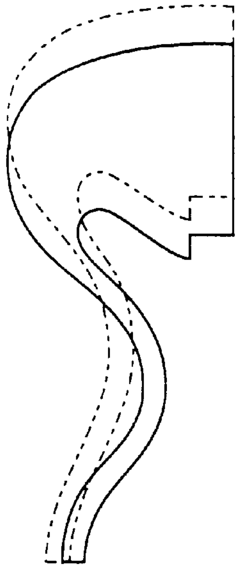
Figure 4D:
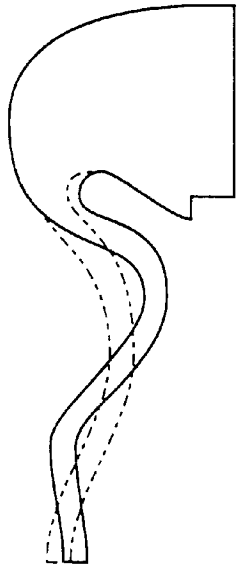

FIG. 3*b* is a full sectional view of the flextensional transducer projector shell illustrated in FIG. 3*a*. The initial, undisplaced, geometry of the shell 200 is shown. In this sense, the shell 200 is in its stationary state. The driver 30 and the shell's 200 bulbous end portions 110, concave middle sections 210, and convex middle sections 220 are illustrated. Note the design's symmetry about the x and y axis. The depth d217 of the shell 200 along the z axis (also referred to as the shell's thickness) is illustrated in FIG. 3*c*, and can be varied depending on the desired acoustic output.

In the embodiment illustrated, there are two opposing convex sections 220 that each have a peak that is substantially aligned with a midpoint of the driver 30, as well as the midpoint of the shell itself. In addition, there is a pair of opposing concave sections 210 (four total) between each bulbous end portion 110 and the opposing convex sections 220.

Other configurations will be apparent in light of this disclosure, such as one with two pairs of opposing convex sections 220, and three pairs of opposing concave sections 210. In such a configuration, the wave profile between the bulbous end portions 110 would run as follows: a first opposing pair of concave sections 220, then a first opposing pair of convex sections, then a second opposing pair of concave sections 220, then a second opposing pair of convex sections, and then a third opposing pair of concave sections 220.

FIGS. 4*a* through 4*d* each illustrate the dynamic modes of vibration associated with shell 200 when driven by the driving material of driver 30. The displacement illustrated is normalized to an arbitrary drive point mechanism. The shell 200 width d217 along the z axis (FIG. 3*c*), as well as the ratio of radius r210 (FIG. 3*a*) of the concave sections 210 to radius r220 (FIG. 3*a*) of the convex section 220, the thickness d215 (FIG. 3*a*) of these sections, the length of the shell along the x axis (FIG. 3*a*), all influence the transducer characteristics. By varying these parameters, the resonant frequency, bandwidth, and effective coupling of the transducer can be adjusted.

For instance, decreasing thickness d215 decreases resonant frequency. The acoustic power output can be generally doubled by doubling the length of the projector along the x axis. As the shell width d217 increases along the z axis, the resonant frequency decreases. Similarly, with increasing length along the x axis, the resonant frequency decreases. Increasing radius r220 of the concave sections relative to radius r220 of the convex section increases the stress on the driver as depth increases. In contrast, increasing radius r220 of the convex section relative to radius r220 of the concave sections decreases the stress on the driver as depth increases. Applying a common radius to both the concave and convex sections enables stress on the driver to be substantially independent of operating depth.

In addition, the stiffness of shell 200 and the amount of stress imparted to the driver 30 (e.g., based on the mechanical quality factor $Q_m$) can be pre-established and maintained. Thus, an appropriate driver 30 material that is to be used with a given shell configuration can be selected based on the pre-established stress.

A flextensional transducer projector shell configured with a wave profile in accordance with the principles of the present invention reduces necessary pre-stress on the transduction driver required by class IV shell geometry, and moderates the tendency of the class VII geometry to increase stress on the driver as depth increases.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A flextensional transducer comprising:

a transduction driver having a first and a second end, and adapted for receiving power from an alternating supply; and a projector shell disposed about the driver, the shell including:

first and second bulbous end portions each adapted to receive a respective end of the transduction driver; and a middle portion having concave sections and convex sections, thereby defining a wave profile.

2. The flextensional transducer of claim 1 wherein the transduction driver includes a plurality of active transducer elements including at least one of piezoelectric elements, ferroelectric elements, and rare earth elements, and the shell is at least one of a solid metal, solid composite, honey comb metallic, and honey comb composite.

3. The flextensional transducer of claim 1 wherein stress on the driver is substantially independent of operating depth.

4. The flextensional transducer of claim 1 wherein each end of the transduction driver is retained in a recess of a respective bulbous end portion.

5. The flextensional transducer of claim 1 wherein there are two opposing convex sections each having a peak that is substantially aligned with a midpoint of the driver.

6. The flextensional transducer of claim 5 wherein there is a pair of opposing concave sections between each bulbous end portion and the opposing convex sections.

7. The flextensional transducer of claim 1 wherein at least four concave sections are each located between a respective bulbous end portion and a respective convex section.

8. The flextensional transducer of claim 1 further comprising:

a flexible water-proof material covering the projector shell and adapted to keep the transduction driver dry.

9. A flextensional transducer projector shell comprising:

first and second bulbous end portions each adapted to receive a respective end of a transduction driver; and a middle portion having concave sections and convex sections, thereby defining a wave profile.

10. The flextensional transducer projector shell of claim 9 wherein the shell is at least one of a solid metal, solid composite, honey comb metallic, and honey comb composite.

11. The flextensional transducer projector shell of claim 9 wherein a recess is defined in each respective bulbous end portion for retaining each end of a transduction driver.

12. The flextensional transducer projector shell of claim 9 wherein the shell has a midpoint, and there are two opposing convex sections each having a peak that is substantially aligned with the midpoint.

13. The flextensional transducer projector shell of claim 12 wherein there is a pair of opposing concave sections between each bulbous end portion and the opposing convex sections.

14. The flextensional transducer projector shell of claim 9 wherein at least four concave sections are each located between a respective bulbous end portion and a respective convex section.

15. The flextensional transducer projector shell of claim 9 further including a flexible water-proof material covering the projector shell.

16. A method of manufacturing a flextensional transducer projector shell, the method comprising:

forming first and second bulbous end portions each adapted to receive a respective end of a transduction driver; and forming a middle portion having concave sections and convex sections, thereby defining a wave profile.

17. The method of claim 16 wherein the first and second bulbous end portions and the middle portion are formed from at least one of a solid metal, solid composite, honey comb metallic, and honey comb composite.

18. The method of claim 16 wherein forming the first and second bulbous end portions includes forming a recess in each respective bulbous end portion for retaining each end of a transduction driver.

19. The method of claim 16 wherein the shell has a midpoint, and forming the middle portion includes forming two opposing convex sections each having a peak that is substantially aligned with the midpoint.

20. The method of claim 19 wherein forming the middle portion includes forming a pair of opposing concave sections between each bulbous end portion and the opposing convex sections.

21. The method of claim 16 wherein forming a middle portion includes forming at least four concave sections that are each located between a respective bulbous end portion and a respective convex section.

22. The method of claim 16 wherein the transduction driver includes a plurality of active transducer elements including at least one of piezoelectric elements, ferroelectric elements, and rare earth elements, the method further comprising:

disposing the shell about the transduction driver with the driver's ends each retained by a respective bulbous end portion, the driver being adapted for receiving power from an alternating supply.

23. The method of claim 16 further including covering the projector shell with a flexible water-proof material.

* * * * *